United States Patent
Weiss

(10) Patent No.: US 8,676,446 B2
(45) Date of Patent: Mar. 18, 2014

(54) CONTROL UNIT FOR PASSENGER PROTECTION AND METHOD FOR TRIGGERING PASSENGER PROTECTION MEANS

(75) Inventor: Timo Weiss, Korntal (DE)

(73) Assignee: Robert Bosch GmbH, Stuttgart (DE)

( * ) Notice: Subject to any disclaimer, the term of this patent is extended or adjusted under 35 U.S.C. 154(b) by 690 days.

(21) Appl. No.: 12/305,058

(22) PCT Filed: Jan. 7, 2008

(86) PCT No.: PCT/EP2008/050092
§ 371 (c)(1),
(2), (4) Date: Sep. 24, 2009

(87) PCT Pub. No.: WO2008/101741
PCT Pub. Date: Aug. 28, 2008

(65) Prior Publication Data
US 2010/0017065 A1    Jan. 21, 2010

(30) Foreign Application Priority Data

Feb. 21, 2007    (DE) .......................... 10 2007 008 383

(51) Int. Cl.
  *B60R 21/01*    (2006.01)
  *H03M 5/12*    (2006.01)
(52) U.S. Cl.
  CPC ................. *B60R 21/01* (2013.01); *H03M 5/12* (2013.01); *B60R 2021/01115* (2013.01)
  USPC ................ 701/45; 341/70; 375/282; 375/333

(58) Field of Classification Search
  USPC ......... 701/45, 1; 375/361, 282, 333; 340/436, 340/438, 500; 708/209; 341/70
  See application file for complete search history.

(56) References Cited

U.S. PATENT DOCUMENTS

| | | | | | |
|---|---|---|---|---|---|
| 4,603,322 | A | * | 7/1986 | Blair ............................. | 375/333 |
| 4,787,095 | A | * | 11/1988 | Forth et al. ..................... | 375/365 |
| 4,881,059 | A | * | 11/1989 | Saltzberg ....................... | 375/333 |
| 5,216,554 | A | * | 6/1993 | Schneider ...................... | 375/376 |
| 5,790,610 | A | * | 8/1998 | Julyan ........................... | 375/361 |
| 5,974,097 | A | * | 10/1999 | Julyan et al. ................... | 375/340 |

(Continued)

FOREIGN PATENT DOCUMENTS

| | | |
|---|---|---|
| DE | 101 14 504 | 10/2002 |
| DE | 101 28 753 | 12/2002 |

(Continued)

OTHER PUBLICATIONS

Natali, "Comparison of Analog and Digital Integrate-and-Dump Filters", Proceedings of the IEEE, Oct. 1969, pp. 1766-1768.*

(Continued)

*Primary Examiner* — John R Olszewski
*Assistant Examiner* — Todd Melton
(74) *Attorney, Agent, or Firm* — Kenyon & Kenyon LLP

(57) ABSTRACT

In a control unit for passenger protection and a method for triggering passenger protection devices, a Manchester-coded signal is supplied by an interface and the Manchester-coded signal is decoded by a coding unit, so that an analyzer unit performs the triggering of passenger protection devices as a function of the decoded signal. The decoding unit uses a shift register structure for decoding and oversampling for the Manchester-coded signal.

24 Claims, 3 Drawing Sheets

(56) References Cited

U.S. PATENT DOCUMENTS

| | | | |
|---|---|---|---|
| 6,014,768 A * | 1/2000 | Lee et al. | 714/795 |
| 6,567,487 B1 * | 5/2003 | Pilz | 375/360 |
| 6,628,212 B1 * | 9/2003 | Toutant | 375/333 |
| 6,943,669 B2 * | 9/2005 | Otterbach et al. | 340/12.33 |
| 7,450,666 B2 * | 11/2008 | Miyanaga et al. | 375/333 |
| 7,469,023 B2 * | 12/2008 | Vasana | 375/342 |
| 7,786,853 B2 * | 8/2010 | Ohl et al. | 340/511 |
| 2002/0133662 A1 * | 9/2002 | Cheung | 710/310 |
| 2002/0163429 A1 | 11/2002 | Otterbach et al. | |
| 2003/0184447 A1 | 10/2003 | Otterbach et al. | |
| 2004/0139369 A1 | 7/2004 | Kirschner | |
| 2004/0264620 A1 * | 12/2004 | Tanaka | 375/375 |
| 2005/0068195 A1 | 3/2005 | Ohl et al. | |

FOREIGN PATENT DOCUMENTS

| | | |
|---|---|---|
| DE | 101 49 332 | 4/2003 |
| DE | 10 2005 041 914 | 3/2006 |
| EP | 1 239 352 | 9/2002 |

OTHER PUBLICATIONS

International Search Report, PCT/EP2008/050092 dated Jul. 1, 2008.

* cited by examiner

CONTROL UNIT FOR PASSENGER PROTECTION AND METHOD FOR TRIGGERING PASSENGER PROTECTION MEANS

FIELD OF THE INVENTION

The present invention relates to a control unit for passenger protection and a method for triggering passenger protection devices.

BACKGROUND INFORMATION

It is already known from DE 101 49 332 that Manchester-coded data are transmitted from a sensor situated outside a control unit for passenger protection to a control unit and are supplied there via an interface. The Manchester-coded data are decoded and passenger protection devices are triggered as a function of these decoded data.

SUMMARY

The control unit according to example embodiments of the present invention and the method according to example embodiments of the present invention for triggering passenger protection devices having the features described herein have the advantage over the related art that a shift register structure is proposed for decoding the Manchester-coded signals and thus a high measure of robustness with respect to interference such as noise, pulse interference and thermal effects is achieved without significantly increasing the complexity. The oversampling also contributes to the increased robustness of signal detection. Due to the oversampling, one data bit is divided into a plurality of samples which may be shifted into the shift register. Detection of one data bit thus becomes very reliable.

In Manchester coding, the information is coded in a flank change. The interface in the present case is an integrated circuit, but it may also be a discrete component or a combination of integrated and discrete components. A software embodiment of the interface or at least a partial embodiment of the interface is also possible in the present case. Possible passenger protection devices include airbags, seat-belt tighteners, crash-activated head supports, pedestrian protection devices and roll bars and others. The signal is usually a sensor signal, but it is also possible for these to be signals of other control units which have preprocessed the signal or a decision that was made on the basis of one or more sensor signals to be transmitted to the control unit according to example embodiments of the present invention. Impact sensors and/or surroundings sensors, for example, may be used as the sensors.

The decoding unit may be a separate electronic module. However, it is also possible for the decoding unit to be present as a software element on a microcontroller in the control unit or another processor. A programmable integrated circuit is also possible in the present case. An approach involving discrete modules is also possible.

The analyzer unit is usually a microcontroller or another processor. However, it is also possible to use so-called ASICs or discrete components.

The shift register structure may involve all possible configurations or combinations of shift registers. Ultimately a single shift register is also possible.

It is particularly advantageous that the shift register structure has two equally long shift registers connected in series. This permits particularly simple and robust methods for decoding the Manchester-coded signal.

In addition, it is advantageous that an adding device is provided for each of the two shift registers for totaling up the contents of the two shift registers. For example, this means that the total contents of the particular shift register are added up on an ongoing basis, so that these two totals may then be processed further, namely by a subtraction device for the two sums, which forms a difference between these two sums. This difference then goes into two branches, namely first into a branch having a value-forming unit and a downstream threshold-value decider to detect whether an unambiguous decision may be made to which the received bit pertains. The second branch has a sign detector with a signum function, so that detection of the bit ultimately takes place. The threshold-value decider and the sign detection are each connected to outputs, which in the simplest case are switches implemented as hardware or software. These switches are preferably triggered as a function of an extreme value search, because the extreme value indicates when detection of the bit may best take place. The elements described in the present case such as the shift registers, the adding device, the subtraction device, the value-forming unit, the threshold-value decider and the sign detector may all be implemented as software. The first and second outputs may also be implemented as software, but it is also possible for these elements to be partially or completely implemented as hardware.

It is also advantageous that, as indicated above, an extreme value search is connected to the shift register structure. This extreme value search then influences the decoding, e.g., as indicated above, by defining the points in time when detection of the bit is to take place. When the corresponding extreme value has been found, the first and second outputs may be enabled because then the output of the sign detector and the threshold-value decider would have to be optimal.

The downstream microcontroller, i.e., the analyzer circuit, receives both signals, namely that of the threshold-value decider and that of the sign detector, to decide as a function of the two signals whether or not processing of the bit may begin.

It is also advantageous that the extreme value search is determined as a function of a new sampled value, which is applied at the input, and as a function of the oldest sampled values of the first and second shift registers. It is thus possible to determine the extreme value. The extreme value may be determined in particular by determining the point in time at which a characteristic value that has previously increased now decreases again. An exact embodiment may fulfill the following equation to determine the extreme value. The oldest sampled value of the second shift register is added to the new sampled value and the oldest sampled value of the first shift register is subtracted from it twice. The first shift register is the shift register to which the new sample is first added, and the second shift register is downstream from this first shift register, so that the oldest value of the second shift register is the oldest value of all.

The shift register structure has the length of one data bit overall, with oversampling determining the number of values. The oversampling may be used in particular with the working cycle, which exists anyway, of the control unit.

Exemplary embodiments of the present invention are depicted in the drawing and explained in greater detail in the following description.

DETAILED DESCRIPTION

Figure 1:
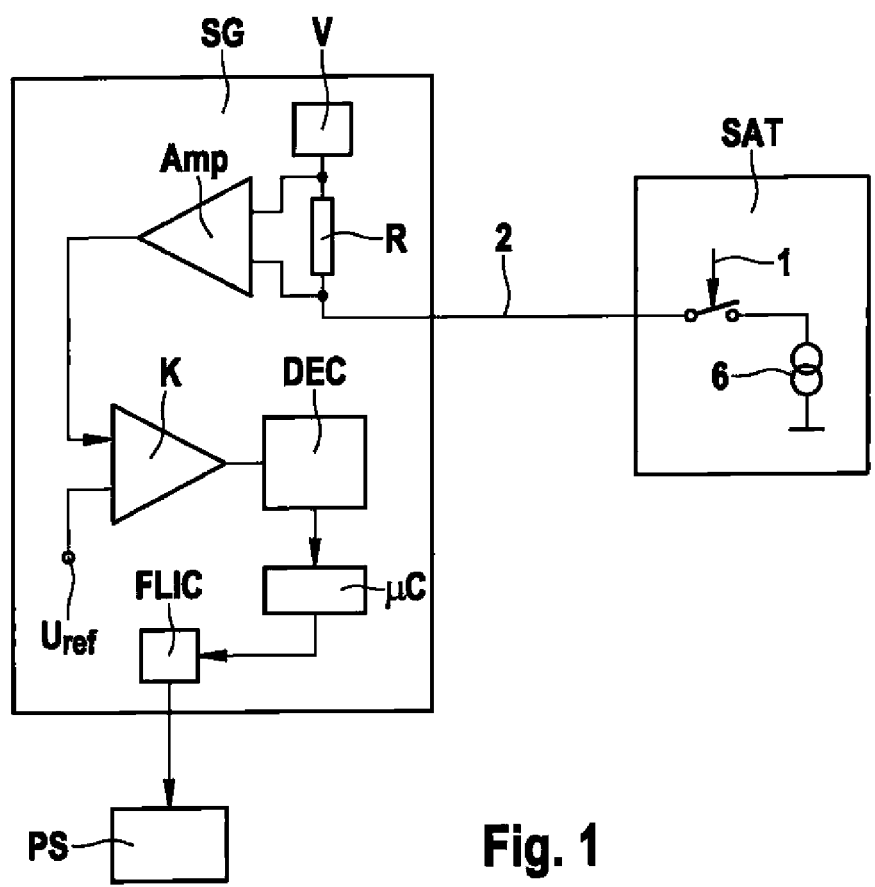
FIG. 1 shows a control unit having a separate satellite, preferably a sensor.

FIG. 1 shows a control unit SG for triggering passenger protection devices PS to which a satellite SAT is connected. This satellite SAT may be an impact sensor, for example, such as an acceleration sensor in the side of the vehicle or the front of the vehicle or a sensor cluster. Other sensors such as structure-borne noise sensors, air pressure sensors, or rotational rate sensors may be represented by satellite SAT in addition to or instead of the former. It is also possible for other control units to be represented by satellite SAT. In the present case, only one satellite is depicted, but it is also possible for a plurality of satellites to be connected to control unit SG in the same manner. The satellite has a current generator 6, which is modulated by electrically controllable switch 1. This modulation is performed by a control circuit as a function of sensor values, for example. In the present case, the information is encoded in a Manchester code. The current pulses are then simply superimposed on the no-signal current of satellite 3 flowing over data transmission line 2. A measuring shunt R is situated in control unit SG between a voltage source V and the data transmission line. The signal voltage, which drops at the resistor and is proportional to the signal current flowing across data transmission line 2, is sent via an amplifier AMP to a comparator K and is compared by this comparator K with a reference voltage $U_{ref}$. With a suitable choice of $U_{ref}$, the status of the transmission line may be estimated on comparator K. If the signal voltage is lower than reference voltage $U_{ref}$, this indicates that no data are being transmitted at the moment and thus only the no-signal current is flowing over data transmission line 2. In this case, a low level is applied at the output of comparator K.

The output of comparator K is sampled and processed digitally, namely by decoding unit DEC. The transmission sequence forming the basis of the wave train modulating the current on transmission line 2 is to be estimated by this sampling during processing. Manchester decoding must therefore be performed now by decoding unit DEC. This is designed according to example embodiments of the present invention. The decoded signal is forwarded to a microcontroller μC, which generates a trigger signal as a function of this signal and also other signals, which are not shown in the present case, along with other components of the control unit, for the sake of simplicity, and transmits this signal to trigger circuit FLIC, which then triggers passenger protection devices PS.

According to example embodiments of the present invention, the binary output of comparator K is sampled, typically using the system clock pulse of control unit SG, e.g., 2 MHz. The resulting binary current is then fed into a shift register structure, which is preferably divided into two halves. The length of the shift register blocks corresponds to the length of a half-bit in sampled values, e.g., when the bit period is 8 ms and the sampling rate of 2 MHz is used, then there are 8 sampled values per shift register block. The sampled values of the Manchester wave train of a data bit are then stored over the entire shift register structure.

Figure 2:
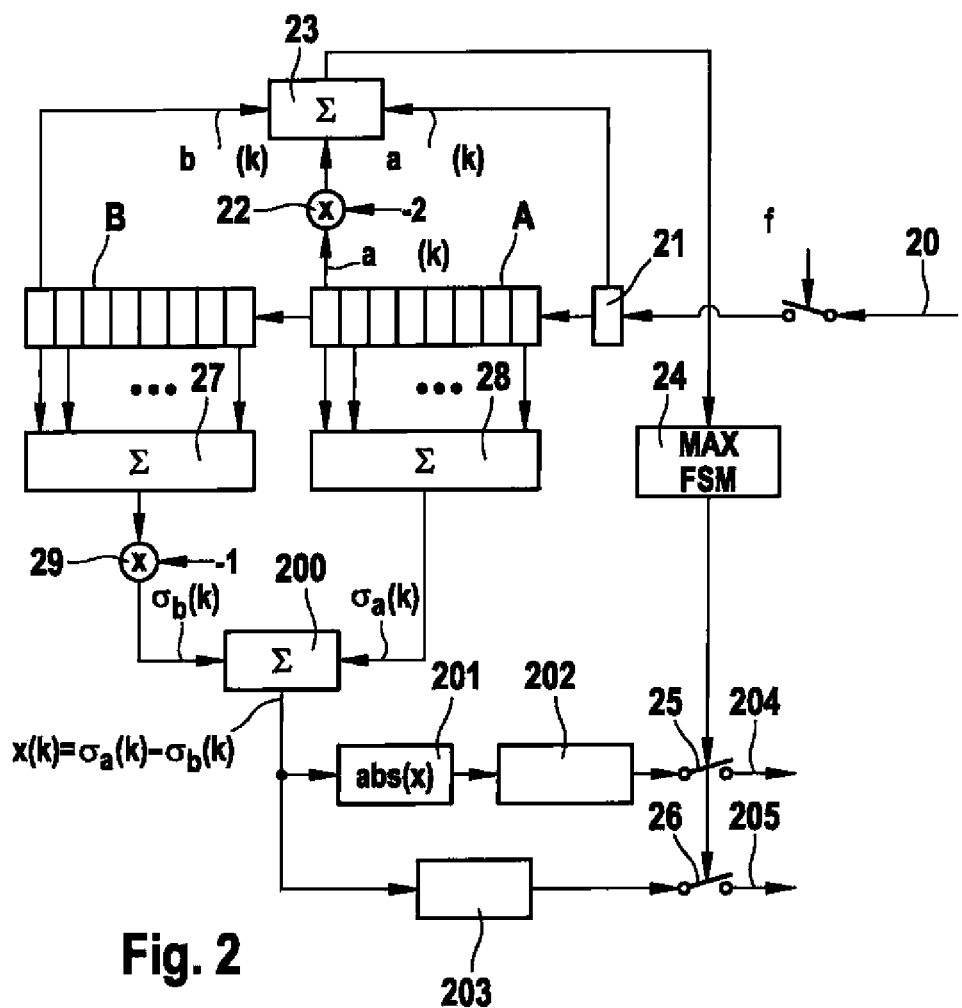
FIG. 2 shows the design of the decoding unit according to example embodiments of the present invention.

Reference numeral 20 denotes the output of comparator K. The binary output current of comparator K is applied here. This binary output current is then oversampled, namely at frequency $f_{sample}$ which is 2 MHz in the present case, as indicated above. The values as a result of this oversampling go to a distributor 21, which is connected to first shift register A on the one hand and to a processor 23 on the other hand and supplies the new sampled value to each of these two components. Second register B is connected downstream from register A. Both registers A and B are connected to adding devices 28 and 27, which add up the entire contents of particular register A or B, so that these sums are then available for further processing. The sum of register block A is entered as $\sigma_a(k)$ by adding device 28 into adding device 200. The sum of shift register B is multiplied by −1 by multiplier 29 at the output, yielding sum $\sigma_b(k)$. Difference $\sigma_a(k)-\sigma_b(k)$ is then formed in adding device 200. This difference is labeled as x(k) in FIG. 2. Value x(k) goes to a value-forming unit 201 and a sign detector 203. Value-forming unit 201 supplies the value to a threshold-value decider 202, which compares this value with a constant threshold value. Sign detector 203 is connected to a switch 26 as the output. Threshold-value decider 202 is connected to a switch 25 at the output. If switches 25 and 26 are closed, detected bit 205 is at the output of switch 26 and information 204 about whether the bit has been reliably detected is at the output of switch 25. Switches 25 and 26 are controlled by extreme value search 24.

Oldest value $a_{old}(k)$ from register A is sent to a multiplier 22, which multiples this value by factor 2. The output of the multiplier is connected to processor 23, to which zero value $a_{new}(k)$ has already been transmitted by distributor 21. Oldest value $b_{old}(k)$ of shift register B is transmitted as the third input value for processor 23. The extreme value is thus formed by the equation $b_{old}(k)+a_{new}(k)-2 \cdot a_{old}(k)$. This value is transmitted to extreme value search 24.

The extreme value search determines the optimal time for the bit decision. The change from x(k) to follow-up value x(k+1) is only by oldest bits $a_{old}(k)$ and $b_{old}(k)$ of two blocks A and B and bit $a_{new}(k)$, which is next shifted into the shift register, i.e., shift register A. The change in output $\delta x(k)=x(k+1)-x(k)$ may be calculated by $\delta x(k)=a_{new}(k)+b_{old}(k)-2a_{old}(k)$. If $\delta x(k)>0$, then x(k) increases with the next step or decreases if $\delta x(k)<0$.

Figure 3:
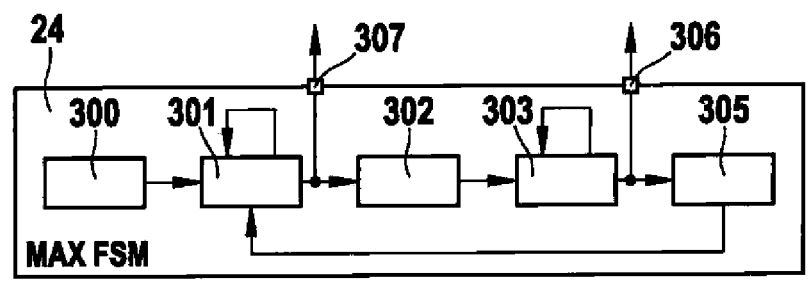
FIG. 3 shows a design of an extreme value search.

An extreme value search may be performed in a particularly efficient manner using variable $\delta x(k)$ and the state machine according to FIG. 3.

FIG. 3 shows extreme value search 24 as a block diagram. The extreme value search is initiated in block 300. A check is performed in block 301 to determine whether the input value is $\delta x(k)>0$, i.e., whether x of k+1 is smaller than its predecessor value x(k) for the first time after a monotonically increasing phase. The same thing is also true with the opposite sign for the minimum search. At output 307, a switch signal for switches 25 and 26 is then output.

However, if the input is less than 0, there is a wait in method step 302 for a predefined waiting period which is explained in the next section. In method step 303, a check is then performed to determine whether the input is <0, i.e., whether there is a change in sign. If this test is terminated, another trigger is output at output 306. In method step 305, there is again a wait to jump back to method step 301.

If sequences of logical zeros and ones appear in the data, this yields extremes at the correlator output, which do not correspond to regular sampling times. These secondary extremes are to be filtered. A secondary extreme always occurs in the middle ($0.5 \cdot T_{bit}$) between two regular sampling times, so that they may be filtered with a simple timer. This filtering is handled by the waiting states in the state machine according to FIG. 3. The waiting time is optimally selected to be 75% of the nominal bit period, as the average between 0.5 $T_{bit}$ and $T_{bit}$.

Alternatively, methods known from the literature for the extreme value search may also be used.

Figure 4:
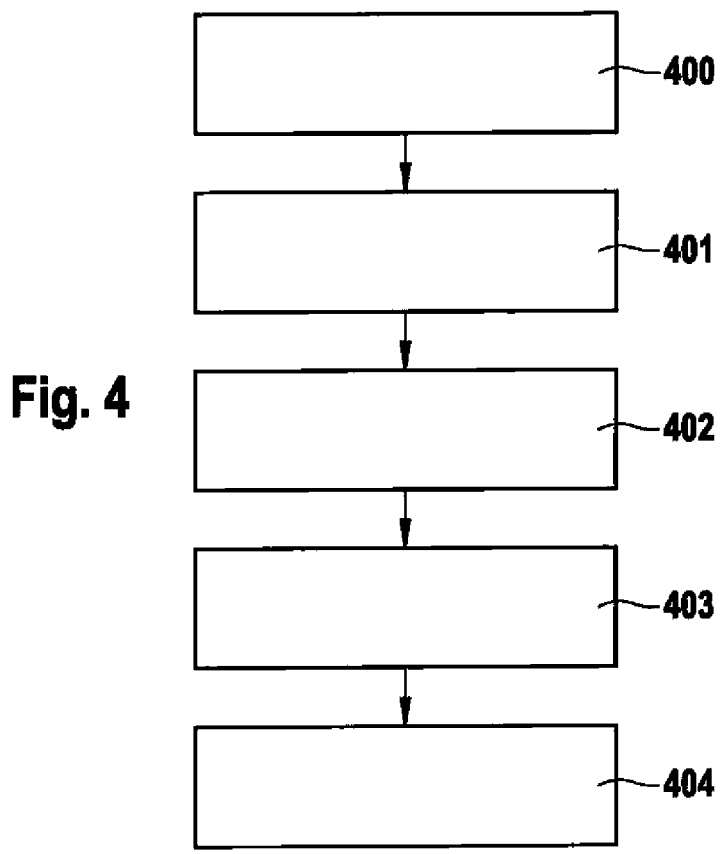
FIG. 4. shows a flow chart of the method according to example embodiments of the present invention.

FIG. 4 shows a flow chart of the method according to example embodiments of the present invention. In method step 404, the Manchester-coded signal is supplied by the interface in the control unit. In method step 401, the decoding is initiated, e.g., by the comparator test of comparator K. In method step 402, the oversampling is performed, preferably with the system clock pulse of the control unit. In method step 403, the actual coding by the shift grill shift register in the form described above and the extreme value search are then performed to optimally select the time at which the decision is to be made about whether the bit has been reliably detected. In method step 404, the decoded signal is then output to the analyzer circuit to decide whether passenger protection device should be triggered.

What is claimed is:

1. A control unit for passenger protection, comprising:
   an interface adapted to a Manchester-coded signal;
   a decoding unit adapted to decode the Manchester-coded signal; and
   an analyzer unit adapted to trigger passenger protection devices based on the decoded signal;
   wherein the decoding unit includes a shift register structure adapted to decode, and oversampling is provided for the Manchester-coded signal,
   wherein there is an adding device adapted to form a sum of at least part of the contents of the shift register structure, a value-forming unit adapted to form a value from the sum, and
   wherein an extreme value search device is connected to the shift register structure, and
   the value-forming unit forms a value when an extreme value is found.

2. The control unit according to claim 1, wherein the shift register structure has two series-connected shift registers of equal length.

3. The control unit according to claim 2, wherein the adding device is adapted to sum the contents of the two shift registers for the two shift registers, wherein there is a subtraction device for the two sums to form a difference, and wherein there is a value-forming unit for the difference to form a value, a threshold-value decider for the value, a sign detector for the difference, a first output for the threshold-value decider for error detection, and a second output for the sign detector for output of the decoded signal.

4. The control unit according to claim 3, wherein the control unit has a working clock pulse and the oversampling is oversampled at substantially the same rate as the working clock pulse.

5. The control unit according to claim 3, wherein the adding device is further adapted to form a sum of each of the two series-connected shift registers of equal length.

6. The control unit according to claim 2, wherein the adding device is further adapted to form a sum of one of the two series-connected shift registers of equal length.

7. The control unit according to claim 1, wherein the shift register structure has a length of one data bit.

8. The control unit according to claim 1, wherein the oversampling uses a working clock pulse of the control unit.

9. The control unit according to claim 1, wherein the control unit has a working clock pulse and the oversampling is oversampled at substantially the same rate as the working clock pulse.

10. A control unit for passenger protection, comprising:
    an interface adapted to a Manchester-coded signal;
    a decoding unit adapted to decode the Manchester-coded signal; and
    an analyzer unit adapted to trigger passenger protection devices based on the decoded signal;
    wherein the decoding unit includes a shift register structure adapted to decode, and oversampling is provided for the Manchester-coded signal,
    wherein the shift register structure has two series-connected shift registers of equal length,
    wherein there is an adding device adapted to sum the contents of the two shift registers for the two shift registers, a subtraction device for the two sums to form a difference, and wherein there is a value-forming unit for the difference, a threshold-value decider for the value, a sign detector for the difference, a first output for the threshold-value decider for error detection, and a second output for the sign detector for output of the decoded signal,
    wherein an extreme value search is connected to the shift register structure, the extreme value search having an influence on the decoding, and
    wherein the extreme value search is connected to the first and second outputs such that the first and second outputs cause an output when an extreme value has been found.

11. A control unit for passenger protection, comprising:
    an interface adapted to a Manchester-coded signal;
    a decoding unit adapted to decode the Manchester-coded signal; and
    an analyzer unit adapted to trigger passenger protection devices based on the decoded signal;
    wherein the decoding unit includes a shift register structure adapted to decode, and oversampling is provided for the Manchester-coded signal,
    wherein the shift register structure has two series-connected shift registers of equal length,
    wherein there is an adding device adapted to sum the contents of the two shift registers for the two shift registers, a subtraction device for the two sums to form a difference, and wherein there is a value-forming unit for the difference, a threshold-value decider for the value, a sign detector for the difference, a first output for the threshold-value decider for error detection, and a second output for the sign detector for output of the decoded signal,
    wherein an extreme value search is connected to the shift register structure, the extreme value search having an influence on the decoding, and
    wherein the extreme value search is adapted so that the extreme value is determined as a function of a new sampled value and of oldest sampled values of the first and second shift registers.

12. The control unit according to claim 11, further comprising:
    a processor element adapted to add the new sampled value to the oldest sampled value of the first shift register and of the oldest sampled value of the second shift register, such that the oldest sampled value of the first shift register is multiplied by 2.

13. A method for triggering a passenger protection device, comprising:
    supplying a Manchester-coded signal;
    decoding the Manchester-coded signal, wherein a shift register structure and oversampling of the signal are used for decoding; and
    triggering the passenger protection device in accordance with the decoded signal;
    forming, using an adding device, a sum of at least part of the contents of the shift register structure; and
    forming, using a value-forming unit, a value from the sum;

wherein an extreme value search device is connected to the shift register structure, and the value-forming unit forms a value when an extreme value is found.

14. The method according to claim 13, wherein the shift register structure has two series-connected shift registers of equal length.

15. The method according to claim 14, wherein an adding device adapted to sum the contents of the two shift registers is provided for the two shift registers, wherein there is a subtraction device for the two sums to form a difference, and wherein a value-forming unit is provided for the difference to form a value, a threshold-value decider is provided for the value, a sign detector is provided for the difference and a first output is provided for the threshold-value decider for error detection, and a second output for the sign detector is provided for output of the decoded signal.

16. The method according to claim 15, wherein the shift register structure has a length of one data bit.

17. The method according to claim 15, wherein the oversampling uses a working clock pulse of the control unit.

18. The method according to claim 15, wherein there is a control unit having a working clock pulse and the oversampling is oversampled at substantially the same rate as the working clock pulse.

19. The method according to claim 13, wherein the shift register structure has a length of one data bit.

20. The method according to claim 13, wherein the oversampling uses a working clock pulse of the control unit.

21. The method according to claim 13, wherein there is a control unit having a working clock pulse and the oversampling is oversampled at substantially the same rate as the working clock pulse.

22. A method for triggering a passenger protection device, comprising:
supplying a Manchester-coded signal;
decoding the Manchester-coded signal; and
triggering the passenger protection devices in accordance with the decoded signal;
wherein a shift register structure and oversampling of the signal are used for decoding,
wherein the shift register structure has two series-connected shift registers of equal length,
wherein an adding device adapted to sum the contents of the two shift registers is provided for the two shift registers, a subtraction device is provided for the two sums to form a difference, and wherein a value-forming unit is provided for the difference, a threshold-value decider is provided for the value, a sign detector is provided for the difference and a first output is provided for the threshold-value decider for error detection, and a second output for the sign detector is provided for output of the decoded signal,
wherein an extreme value search is connected to the shift register structure, the extreme value search having an influence on the decoding, and
wherein the extreme value search is connected to the first and second outputs such that the first and second outputs cause an output when an extreme value has been found.

23. A method for triggering a passenger protection device, comprising:
supplying a Manchester-coded signal;
decoding the Manchester-coded signal; and
triggering the passenger protection devices in accordance with the decoded signal;
wherein a shift register structure and oversampling of the signal are used for decoding,
wherein the shift register structure has two series-connected shift registers of equal length,
wherein an adding device adapted to sum the contents of the two shift registers is provided for the two shift registers, a subtraction device is provided for the two sums to form a difference, and wherein a value-forming unit is provided for the difference, a threshold-value decider is provided for the value, a sign detector is provided for the difference and a first output is provided for the threshold-value decider for error detection, and a second output for the sign detector is provided for output of the decoded signal,
wherein an extreme value search is connected to the shift register structure, the extreme value search having an influence on the decoding, and
wherein the extreme value search is adapted so that the extreme value is determined as a function of a new sampled value and of oldest sampled values of the first and second shift registers.

24. The method according to claim 23, wherein there is a processor element adapted to add the new sampled value to the oldest sampled value of the first shift register and of the oldest sampled value of the second shift register, such that the oldest sampled value of the first shift register is multiplied by 2.

* * * * *

UNITED STATES PATENT AND TRADEMARK OFFICE
CERTIFICATE OF CORRECTION

PATENT NO.         : 8,676,446 B2                                                          Page 1 of 1
APPLICATION NO.    : 12/305058
DATED              : March 18, 2014
INVENTOR(S)        : Timo Weiss It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 858 days.

Signed and Sealed this

Twenty-ninth Day of September, 2015

Michelle K. Lee
*Director of the United States Patent and Trademark Office*